United States Patent [19]
Clements et al.

[11] Patent Number: 5,928,076
[45] Date of Patent: Jul. 27, 1999

[54] EMI-ATTENUATING AIR VENTILATION PANEL

[75] Inventors: Brad E. Clements; Kristina L. Mann, both of Fort Collins, Colo.; Andrew M. Cherniski, Rescue, Calif.

[73] Assignee: Hewlett Packard Company, Palo Alto, Calif.

[21] Appl. No.: 08/937,933

[22] Filed: Sep. 25, 1997

[51] Int. Cl.⁶ .................................................. H05K 7/20
[52] U.S. Cl. ........................ 454/184; 174/35 R; 361/693
[58] Field of Search .................... 454/184; 174/35 R, 174/35 C, 35 MS; 55/307; 361/695, 694, 693

[56] References Cited

U.S. PATENT DOCUMENTS 4,631,641  12/1986  Brombal et al. ...................... 174/35 R
5,285,350   2/1994  Villaume .............................. 454/184 X
5,707,282   1/1998  Clements et al. ........................ 454/184

FOREIGN PATENT DOCUMENTS

59-3902   1/1984  Japan .................................. 174/35 MS

*Primary Examiner*—Harold Joyce

[57] ABSTRACT

EMI-attenuating air ventilation panel for electrical and electronic systems. An opening through a metallic panel is realized using an extrusion method in order to obtain a tube leaving the opening at one end. The periphery of the opening at the other side of the extruded tube has a smooth edge in order to improve air circulation. A multitude of such extruded holes are critically placed on the panel to form an array. The panel in turn is mounted in an electrical or electronic system to allow air cooling while the extruded tubes attenuate EMI radiation to and from electrical circuits.

21 Claims, 4 Drawing Sheets

EMI-ATTENUATING AIR VENTILATION PANEL

FIELD OF THE INVENTION

The present invention generally relates to electrical and electronic apparatus. More particularly, the invention relates to apparatus for cooling an electrical or electronic system, and for shielding electromagnetic interference (EMI) radiation generated by the system during operation thereof.

BACKGROUND OF THE INVENTION

In today's competitive electronics marketplace, there is a demand for higher frequency computer components while consumers demand smaller packaging. These requirements have lead to much higher temperatures within the electronic package, requiring more cooling. Higher frequency computer components are also generating more electromagnetic interference or EMI in addition to the heat which, if not properly shielded, can interfere with other electronic equipment by way of radiation or conduction. Consequently, electronic manufacturers often face a design trade-off between cooling the package and shielding for EMI, since EMI radiation typically escapes through air holes commonly used for cooling purposes. It should efficiently be noted that radiations generated by electronic packages can include electromagnetic energy of wavelengths along various points of the spectrum such as radio frequency interference. As used herein, the term electromagnetic interference (EMI) refers to interfering electromagnetic energy of any wavelength.

Printed circuit boards used in various types of electronic equipment are typically mounted within a housing structure. During operation of the circuit board, EMI radiation is generated within the board, emanates therefrom, and must be substantially prevented from escaping outwardly through the housing structure. One solution to the above problem is to provide the housing with the necessary EMI radiation shield by coating the interior of the housing with a metallic material which is brought into contact with a grounding portion of the electronic circuits, such as the ground plane of the circuit board disposed within the housing. Other types of EMI shields positioned around the circuit board may be alternatively used. For instance it has been realized in the art that a foil shield, placed around the electronic circuitry and connected to ground would reduce EMI radiations. Typically aluminum or copper is used for such shields. However, such aluminum and copper foil shields, while somewhat effective, have proven to be costly to manufacturers. Moreover, none of the above solutions facilitate air circulation or improve cooling capabilities of the system.

In order to allow air circulation while reducing EMI, arrays of small flat holes have been used to shield against EMI, but the holes had to be so small that dust and lint would easily collect and clog the holes. In another solution, stacked plates of holes arranged into an array have been used, but the weight and cost of this solution make it unattractive. Yet another solution known in the art uses screen meshes, but this solution creates a high impedance air flow and presents a great risk of lint and dust build-up. Honeycomb vents have also been used for the same purpose, but the cost is prohibitive.

Accordingly, it is an object of the present invention to attenuate EMI radiation entering or leaving electronic packages to an acceptable level. It is a further object of the invention to produce an EMI radiation shielding device which allows for low impedance airflow through the package for cooling purposes. It is a further object of the invention to lower the cost compared to traditional EMI solutions. It is a still further object to reduce problems related to lint and dust collection around cooling holes.

SUMMARY OF THE INVENTION

In an embodiment, the invention includes an EMI-attenuating air ventilation panel for an electronic device enclosure. This air ventilation panel is typically made of an electrically conductive panel such as a metallic panel, and includes at least one air ventilation hole in it. Around the periphery of the air ventilation hole a tube is electrically and mechanically connected to the panel. The axis of the tube is approximately perpendicular to the panel. The ventilation panel has consequently two distinguishable sides, respectively referred to as upstream and downstream airflow sides. The downstream airflow side is the side where the tube is attached to the panel, and the upstream airflow side is the other side of the panel. As indicated by their names, the airflow preferably flows from the upstream air flow side, through the tube, and out to the downstream air flow side. It should also be noted that both the air ventilation hole and the electrically conductive tube typically have a circular cross section. The most common conductive material used for the manufacturing of the panel is metal. The tube leaving a ventilation hole from around its perimeter is formed with extruded metal.

In another embodiment, the invention includes an EMI-attenuating air ventilation panel for an electronic device enclosure with a plurality of air ventilation holes formed in it. Each of these air ventilation holes has an electrically conductive tube which is both electrically and mechanically coupled to the panel at the periphery of the air ventilation hole. The axis of the tube extends away from the panel in a direction approximately normal to the panel. Both the air ventilation hole and the tube have typically a circular cross section. The side of the ventilation panel where the tubes are connected is referred to as the downstream airflow side. The other side is the upstream airflow side. An air ventilation hole has a smooth edge around its periphery on the upstream airflow side of the electrically conductive panel. This facilitates air circulation through the tube. A typical material used for the panel is a zinc-plated steel sheet having a thickness of approximately 1 mm. The electrically conductive tubes can then be extruded from the sheet of zinc-plated steel. The length-to-diameter ratio of each of the electrically conductive tubes is between approximately 0.5 and 1.0. Each of the tubes has a length of approximately 3.5 mm, and a diameter of approximately 4.8 mm. The relative spacing of the air ventilation holes is approximately 8.5 mm center-to-center.

In a further embodiment, the invention includes an electronic device enclosure having improved air ventilation and EMI attenuation characteristics. This enclosure includes a casing; an EMI-attenuating air ventilation panel made with an electrically conductive panel having a plurality of air ventilation holes formed in it; and a cooling fan for circulating air into the casing through the air ventilation holes. Each of the ventilation holes has an electrically conductive tube which is electrically and mechanically coupled to the panel at the periphery of the air ventilation hole with the axis of the tube extending away from the panel in an approximately perpendicular direction relative to the panel. The air ventilation holes and the tubes have typically a circular cross section. The side of the panel with the tubes is referred to as the downstream airflow side, with the other side being the upstream airflow side. The periphery of a hole has a smooth edge on the upstream airflow side in order to facilitate airflow from the upstream airflow side, through the tube, and out to the downstream airflow side. A typical material used for the panel is a zinc-plated steel sheet having a thickness of approximately 1 mm. The electrically conductive tubes can then be extruded from the sheet of zinc-plated steel. The length-to-diameter ratio of each of the electrically conductive tubes is between approximately 0.5 and 1.0. Each of the tubes has a length of approximately 3.5 mm, and a diameter of approximately 4.8 mm. The relative spacing of the air ventilation holes is approximately 8.5 mm center-to-center.

DETAILED DESCRIPTION OF THE PREFERRED EMBODIMENTS

As shown in the drawings for purposes of illustration, the invention is embodied in a novel air ventilation panel for cooling and EMI containment. A system according to the invention provides substantial EMI attenuation entering or leaving packages on a circuit board; while reducing airflow impedance through the package and therefore improving the cooling capabilities of the system. Existing solutions such as honeycomb vents, screen meshes, stacked perforated plates and various others have typically several disadvantages such as allowing a difficult airflow, being prone to dust and lint collection and clogging, heavy weight, and high manufacturing costs.

An EMI-attenuating air ventilation panel according to the present invention provides a multitude of extruded air ventilation holes for EMI containment and cooling. The resulting panel is simple and cost-effective. It provides an efficient EMI containment solution at a lower cost and adds only a low impedance to the airflow through the system. Additional advantages include reducing product weight, and minimizing the risk of inadequate cooling due to lint and dust collection.

Figure 1:
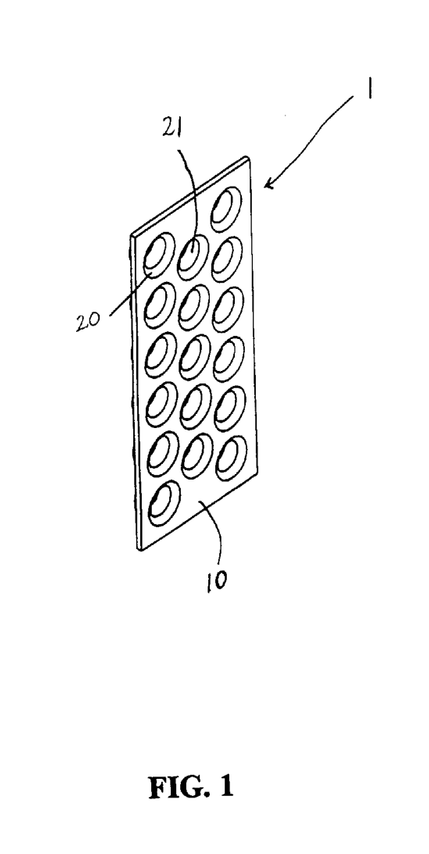
FIG. 1 is an oblique view of the upstream airflow side of an EMI-attenuating air ventilation panel with 17 air ventilation holes according to the present invention.
Figure 2:
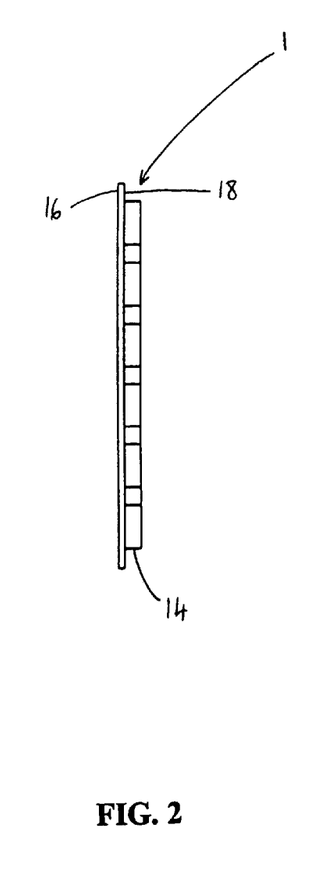
FIG. 2 is a side view of the ventilation panel of FIG. 1.
Figure 3:
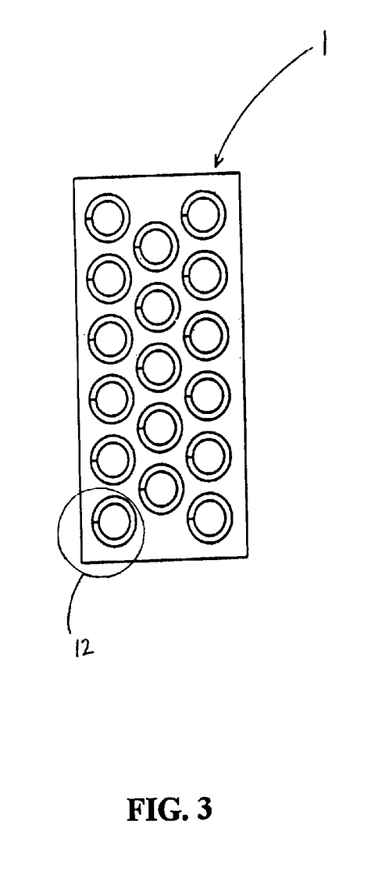
FIG. 3 is a frontal view of the upstream airflow side of the ventilation panel of FIG. 1 showing the smooth surface around the periphery of the air ventilation holes for an improved airflow through the tube.
Figure 4:
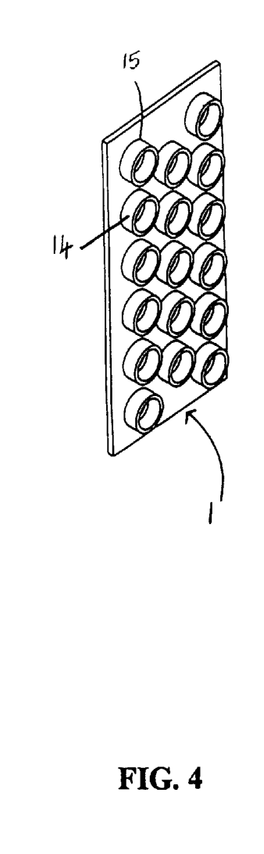
FIG. 4 is an oblique view of the downstream airflow side of the ventilation panel of FIG. 1.

Depicted in FIG. 1 is an oblique view of an EMI-attenuating air ventilation panel 1 for an electronic device enclosure. The ventilation panel includes an electrically conductive panel 10 having an air ventilation hole 12 formed in it. FIG. 2 is a side view of the ventilation panel and depicts an electrically conductive tube 14 which is electrically and mechanically coupled to the electrically conductive panel at the periphery 15 of an air ventilation hole. The electrically conductive tube 14 illustrated in the preferred embodiment has a cylindrical interior wall surface 21. The axis of this electrically conductive tube extends away from the electrically conductive panel in a direction approximately normal to the electrically conductive panel. FIG. 3 shows a side of the ventilation panel referred to as the upstream airflow side 16. Similarly, the opposite side of the ventilation panel which is viewed in FIG. 4 is referred to as the downstream airflow side 18. As depicted in the figures, a smooth surface 20 joins the upstream airflow side of the electrically conductive panel with the inner surface 21 of the electrically conductive tube. The air ventilation hole and the electrically conductive tube both have typically a circular cross section. The most common material used for the EMI-attenuating air ventilation panel is usually metal. Accordingly, the electrically conductive tube is made with extruded metal.

Figure 5:
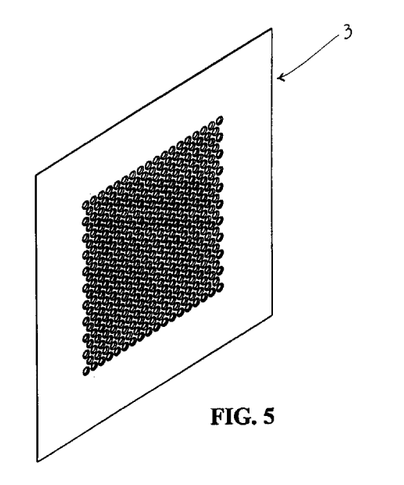
FIG. 5 is an oblique view of the upstream airflow side of an EMI-attenuating air ventilation panel.
Figure 6:
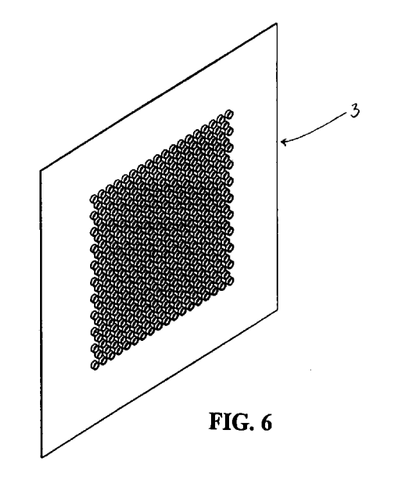
FIG. 6 is an oblique view of the downstream airflow side of the EMI-attenuating air ventilation panel of FIG. 5.
Figure 7:
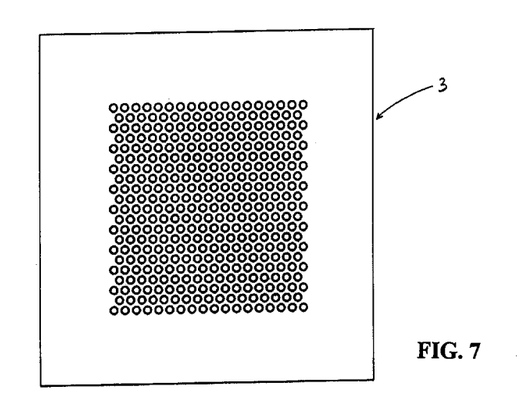
FIG. 7 is a frontal view of the upstream airflow side of the EMI-attenuating air ventilation panel of FIG. 5.

Another embodiment is depicted in FIGS. 5–7, showing an EMI-attenuating air ventilation panel 3 for an electronic device enclosure with a plurality of air ventilation holes formed in it. Each of these air ventilation holes has an electrically conductive tube which is both electrically and mechanically coupled to the panel at the periphery of the air ventilation hole. The axis of the tube extends away from the panel in a direction approximately normal to the panel. Both the air ventilation hole and the tube have typically a circular cross section. FIG. 6 illustrates the side of the ventilation panel where the tubes are connected to the panel around each air ventilation hole, which is referred to as the downstream airflow side. The other side of the ventilation panel is the upstream airflow side, depicted in FIG. 5 and FIG. 7. An air ventilation hole has a smooth edge around its periphery on the upstream airflow side of the electrically conductive panel. This facilitates air circulation through the tube. A typical material used for the panel is a zinc-plated steel sheet having a thickness of approximately 1 mm. The electrically conductive tubes can then be extruded from the sheet of zinc-plated steel. The length-to-diameter ratio of each of the electrically conductive tubes is usually between approximately 0.5 and 1.0. Each of the tubes has typically a length of approximately 3.5 mm, and a diameter of approximately 4.8 mm. The relative spacing of the air ventilation holes is approximately 8.5 mm center-to-center.

Figure 8:
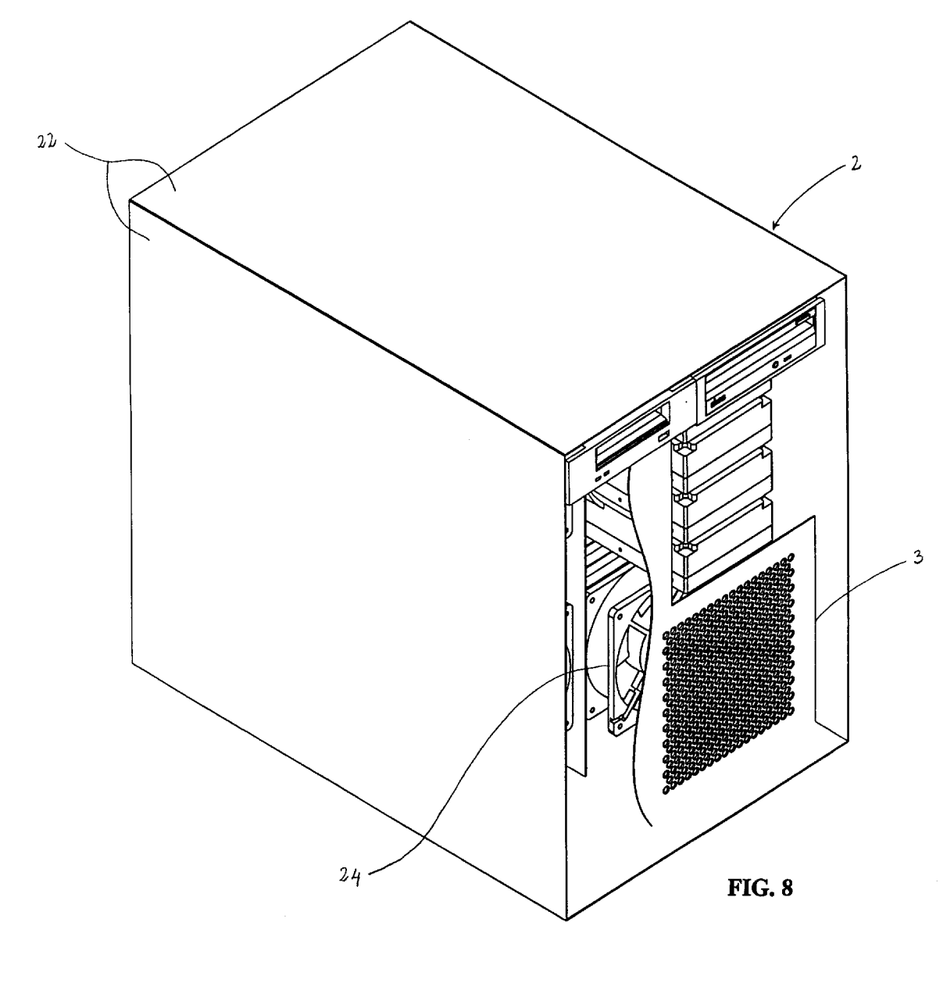
FIG. 8 is an oblique cut-away view of an electronic device enclosure having a cooling fan and an EMI-attenuating air ventilation panel.

In yet another embodiment, the invention includes an electronic device enclosure 2 having improved air ventilation and EMI attenuation characteristics as depicted in FIG. 8. This enclosure includes a casing 22; an EMI-attenuating air ventilation panel 3 made with an electrically conductive panel having a plurality of air ventilation holes formed in it; and a cooling fan 24 for circulating air into the casing through the air ventilation holes. Each of the ventilation holes has an electrically conductive tube which is electrically and mechanically coupled to the panel at the periphery of the air ventilation hole with the axis of the tube extending away from the panel in an approximately perpendicular direction relative to the panel. The air ventilation holes and the tubes have typically a circular cross section. The side of the panel with the tubes is referred to as the downstream airflow side, with the other side being the upstream airflow side. The periphery of a hole has a smooth edge on the upstream airflow side in order to facilitate airflow from the upstream airflow side, through the tube, and out to the downstream airflow side of the panel. The smooth edge improves the circulation of air through the tube, compared to an opening with sharp edges. A typical material used for the panel is a zinc-plated steel sheet having a thickness of approximately 1 mm. The electrically conductive tubes can then be formed in the sheet of zinc-plated steel using an extruding operation. Through an iterative process, the optimum hole spacing can be determined for any given material and set of constraints. For example, in the case of 1 mm thick zinc-plated steel, the optimal length-to-diameter ratio of each of the electrically conductive tubes is determined to be between approximately 0.5 and 1.0 in order to allow the greatest number of holes for a given area. Accordingly, each of the tubes has a length of approximately 3.5 mm, and a diameter of approximately 4.8 mm. These tubes act as a collection of waveguide below cutoff attenuators. The cross sectional dimensions of do not support propagation of electromagnetic energy below a wavelength related to those dimensions. Consequently, the EMI is effectively attenuated by the length of the tube leaving the air ventilation hole, and the panel is nearly opaque to signals below that cutoff frequency. The relative spacing of the air ventilation holes is approximately 8.5 mm center-to-center.

Figure 9:
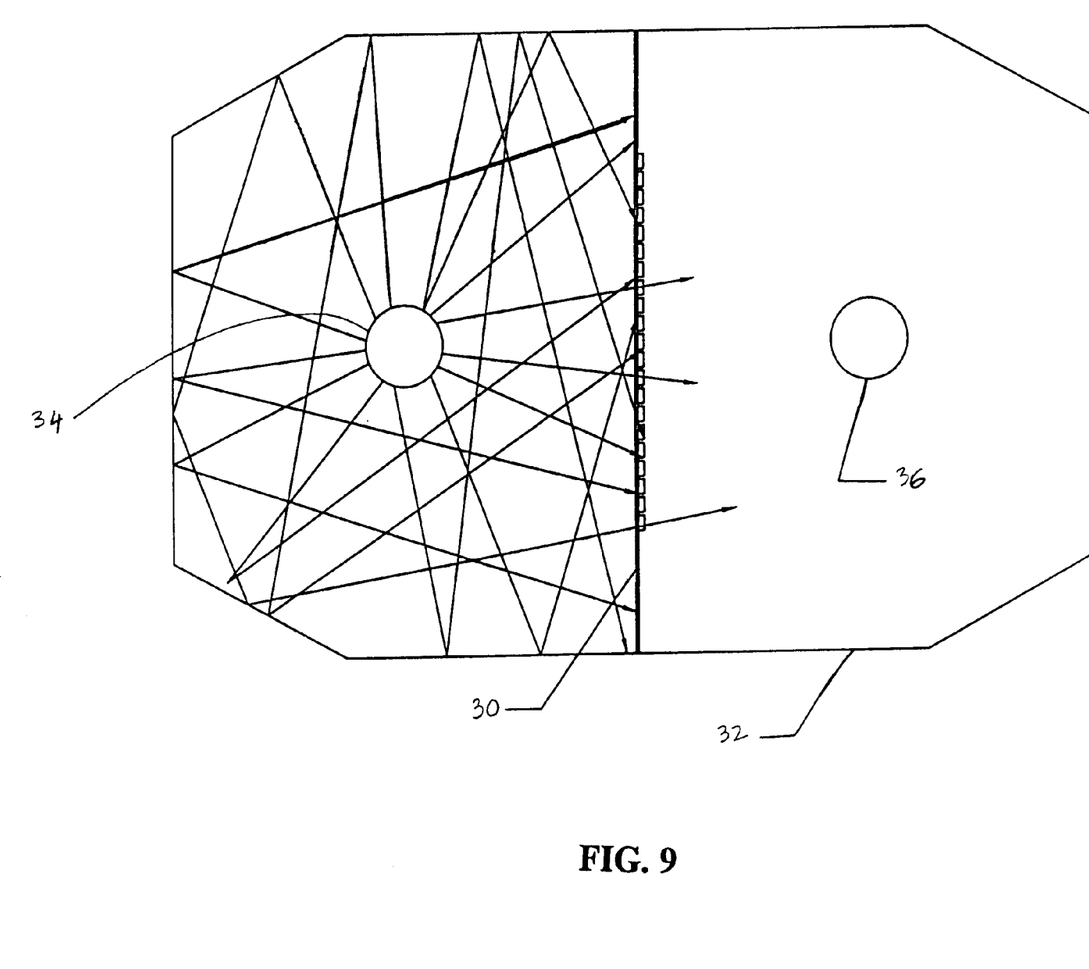
FIG. 9 is a simplified side view of a test setup for EMI attenuation measurement of the air ventilation panel according to the present invention.

As discussed above, the EMI-attenuating air ventilation panel described in this disclosure provides a superior barrier for radiated electromagnetic emissions when compared to a conventional "flat" hole array structure. This design provides extruded hole walls creating a conductive tube at each hole location. The tube acts as a waveguide below cutoff, resulting in significant signal attenuation at high frequencies. This technique mimics the performance of honeycomb filter assemblies at a much lower cost basis. Extensive testing has confirmed the superiority of the present invention. One such test was performed with two sample panels having a six-inch by six-inch array of holes. One sample containing conventional holes was used as the control element in this test. The other sample contained the extruded hole design described in this disclosure, and is represented as the panel 30 in FIG. 9. The tests were conducted using a custom-built shielding effectiveness tester (SET) 32. This test fixture features near-field source excitation with mode stirring at both the source 34 and the antennae 36. The frequency range of the test represents the maximum flat response region of the SET fixture (290 MHZ to 2 GHZ). All readings are relative to a normalized baseline where no test sample is in place. Testing in the SET fixture demonstrates a shielding effectiveness of 25 dB for the flat hole structure and a superior 40 dB for the extruded structure. A 15 dB increase in shielding effectiveness translates to more than a five to one signal reduction. This method of testing is representative of actual computer product implementations of EMI shielding solutions. Good correlation has been demonstrated between SET testing and testing performed in FCC qualified chambers. The FCC is a U.S. regulatory body requiring that manufacturers of certain classes of electronic equipment test and certify that radio frequency emissions from that equipment are within prescribed limits. Based on these tests, the disclosed EMI-attenuating air ventilation panel featuring extruded tubes offers superior shielding performance over more conventional "flat" structures.

From the foregoing it will be appreciated that the EMI-attenuating air ventilation panel provided by the invention represents a significant advance in the art. The present invention provides a single cost-effective, easy, and efficient way to satisfy two demanding requirements of most electrical and electronic systems: Cooling and EMI attenuation. An air ventilation panel embodying the invention attenuates EMI radiation entering or leaving the package to an acceptable level, while allowing for low impedance airflow through the system since no significant resistance is imposed to the airflow within the system. In addition to its elegant simplicity, the invention lowers the cost and the weight of the final product compared to traditional EMI solutions. Moreover, since the extruded holes can be larger and still contain EMI radiation, the problem of lint and dust collection around the holes is also eliminated. A panel embodying the present invention has the additional advantages of being light-weight, easy to manufacture, easy to assemble and disassemble in a system, and easy to clean.

While the invention has been described in detail in relation to a particular embodiment thereof, this description is intended to be illustrative only. It will be obvious to those skilled in the art that many modifications can be made to the described embodiment without departing from the spirit and scope of the invention, and that such modifications will remain within the scope of the following claims.

What is claimed is:

1. An EMI-attenuating air ventilation panel for an electronic device enclosure, comprising:

an electrically conductive panel having a ventilation hole formed in it, wherein said electrically conductive panel has an upstream airflow side and a downstream airflow side;

a waveguide electrically and mechanically coupled to said electrically conductive panel at the periphery of said air ventilation hole, the axis of said waveguide extending away from said electrically conductive panel in a direction approximately normal to said conductive panel; and a smooth surface joining said upstream airflow side of said electrically conductive panel with the inner surface of said waveguide.

2. An EMI-attenuating air ventilation panel according to claim 1, wherein said air ventilation hole has an unrestricted circular cross section and said waveguide defines an air passageway having an unrestricted circular cross section.

3. An EMI-attenuating air ventilation panel according to claim 1, wherein said electrically conductive panel comprises metal, and said waveguide comprises extruded metal.

4. An EMI-attenuating air ventilation panel according to claim 1, wherein said waveguide is an electrically conductive tube having a substantially constant and unrestricted cross sectional area.

5. An EMI-attenuating air ventilation panel according to claim 4, wherein said electrically conductive tube has a substantially cylindrical interior surface.

6. An EMI-attenuating air ventilation panel for an electronic device enclosure, comprising:

an electrically conductive panel having a plurality of air ventilation holes formed in it, wherein said electrically conductive panel has an upstream airflow side and a downstream airflow side;

each of said plural air ventilation holes having a waveguide electrically and mechanically coupled to said electrically conductive panel at the periphery of the air ventilation hole, the axis of said waveguide extending away from said electrically conductive panel in a direction approximately normal to said conductive panel; and a plurality of smooth surfaces joining said upstream airflow side of said electrically conductive panel with the inner surface of each of said waveguides.

7. An EMI-attenuating air ventilation panel according to claim 6, wherein each of said plural air ventilation holes has an unrestricted circular cross section and each of said waveguides defines an air passageway having an unrestricted circular cross section.

8. An EMI-attenuating air ventilation panel according to claim 6, wherein said electrically conductive panel comprises a piece of zinc-plated steel having a thickness of approximately 1 mm, and wherein said waveguides comprise extruded portions of said piece of zinc-plated steel.

9. An EMI-attenuating air ventilation panel according to claim 8, wherein each of said plural air ventilation holes has an unrestricted circular cross section and each of said waveguides defines an air passageway having an unrestricted circular cross section, and wherein the length-to-diameter ratio of each of said waveguides is between approximately 0.5 and 1.0.

10. EMI-attenuating air ventilation panel according to claim 9, wherein the length of each of said waveguides is approximately 3.5 mm, and the diameter of each of said waveguides is approximately 4.8 mm.

11. An EMI-attenuating air ventilation panel according to claim 9, wherein the spacing of said plural air ventilation holes is approximately 8.5 mm center-to-center.

12. An EMI-attenuating air ventilation panel according to claim 6, wherein each of said waveguides are electrically conductive tubes having substantially constant and unrestricted cross sectional areas.

13. An EMI-attenuating air ventilation panel according to claim 12, wherein said electrically conductive tubes have substantially cylindrical interior surfaces.

14. An electronic device enclosure having air ventilation and EMI-attenuation characteristics comprising:

a casing;

at least one EMI-attenuating air ventilation panel, each comprising an electrically conductive panel having at least one air ventilation hole formed in it, wherein each of said ventilation holes has a waveguide electrically and mechanically coupled to said electrically conductive panel at the periphery of said air ventilation holes, the axis of said waveguides extending away from said electrically conductive panel in a direction approximately normal to said electrically conductive panel, wherein said electrically conductive panel has an upstream airflow side and a downstream airflow side;

a smooth surface joining said upstream airflow side of said electrically conductive panel with the inner surface of each of said waveguides; and a cooling fan for circulating air into said casing through said air ventilation holes.

15. An electronic device enclosure according to claim 14, wherein each of said plural air ventilation holes has an unrestricted circular cross section and each of said waveguides defines an air passageway having an unrestricted circular cross section.

16. An electronic device enclosure according to claim 14, wherein said electrically conductive panel comprises a piece of zinc-plated steel having a thickness of approximately 1 mm, and wherein said waveguides comprise extruded portions of said piece of zinc-plated steel.

17. An electronic device enclosure according to claim 14, wherein each of said plural air ventilation holes has an unrestricted circular cross section and each of said waveguides defines an air passageway having an unrestricted circular cross section, and wherein the length-to-diameter ratio of each of said waveguides is between 0.5 and 1.0.

18. An electronic device enclosure according to claim 14, wherein the length of each of said waveguides is approximately 3.5 mm, and the diameter of each of said waveguides is approximately 4.8 mm.

19. An electronic device enclosure according to claim 14, wherein said EMI-attenuating panel has a plurality of air ventilation holes, wherein the spacing of said plural air ventilation holes is approximately 8.5 mm center-to-center.

20. An EMI-attenuating air ventilation panel according to claim 14, wherein each of said waveguides are electrically conductive tubes having substantially constant cross sectional areas.

21. An EMI-attenuating air ventilation panel according to claim 14, wherein said electrically conductive tubes have substantially cylindrical interior surfaces.

* * * * *

(12) REEXAMINATION CERTIFICATE (4319th)

United States Patent
Clements et al.

(10) Number: US 5,928,076 C1
(45) Certificate Issued: Apr. 24, 2001

(54) EMI-ATTENUATING AIR VENTILATION PANEL

(75) Inventors: Brad E. Clements; Kristina L. Mann, both of Fort Collins, CO (US); Andrew M. Cherniski, Rescue, CA (US)

(73) Assignee: Hewlett-Packard Company, Palo Alto, CA (US)

Reexamination Request:
No. 90/005,669, Mar. 6, 2000

Reexamination Certificate for:
Patent No.: 5,928,076
Issued: Jul. 27, 1999
Appl. No.: 08/937,933
Filed: Sep. 25, 1997

(51) Int. Cl.$^7$ ........................................ H05K 7/20
(52) U.S. Cl. .................. 454/184; 174/35 R; 361/693
(58) Field of Search ................ 154/184; 174/35 R, 174/35 C, 35 MS; 55/307; 361/695, 694, 693

(56) References Cited

U.S. PATENT DOCUMENTS

| | | | |
|---|---|---|---|
| 4,631,641 | * 12/1986 | Brombal et al. | 174/35 R |
| 5,285,350 | * 2/1994 | Villaume | 454/184 X |
| 5,401,914 | 3/1995 | Curran et al. | 174/356 |
| 5,707,282 | * 1/1998 | Clements et al. | 454/184 |

FOREIGN PATENT DOCUMENTS

| | | | |
|---|---|---|---|
| 364 441 | 10/1981 | (AT) . | |
| 2 741 504 | 5/1997 | (FR) . | |
| 59-3902 | * 1/1984 | (JP) | 174/35 MS |

OTHER PUBLICATIONS

"Modeled and Measured Results from Two Proposed Standard EMI Modeling Problems," *IEEE 1995 International Symposium on Electromagnetic Compatibility*, Aug. 14–18, 1995, p. 349–352, by Bruce Archambeault and Colin Brench.

European Search Report of Application No. EP 98 30 6982 dated Jun. 11, 1999, 3 pages.

* cited by examiner

*Primary Examiner*—Harold Joyce (57) ABSTRACT

EMI-attenuating air ventilation panel for electrical and electronic systems. An opening through a metallic panel is realized using an extrusion method in order to obtain a tube leaving the opening at one end. The periphery of the opening at the other side of the extruded tube has a smooth edge in order to improve air circulation. A multitude of such extruded holes are critically placed on the panel to form an array. The panel in turn is mounted in an electrical or electronic system to allow air cooling while the extruded tubes attenuate EMI radiation to and from electrical circuits.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 6 and 14 are determined to be patentable as amended.

Claims 2–5, 7–13 and 15–21, dependent on an amended claim, are determined to be patentable.

1. An EMI-attenuating air ventilation panel for an electronic device enclosure, comprising:
    an electrically conductive panel having a ventilation hole formed in it, wherein said electrically conductive panel has an upstream airflow side and a downstream airflow side;
    a waveguide electrically and mechanically coupled to said electrically conductive panel at the periphery of said air ventilation hole, the axis of said waveguide extending away from said electrically conductive panel in a direction approximately normal to said conductive panel; and
    a smooth [surface] *transition* joining said upstream airflow side of said electrically conductive panel with the inner surface of said waveguide.

6. An EMI-attenuating air ventilation panel for an electronic device enclosure, comprising:
    an electrically conductive panel having a plurality of air ventilation holes formed in it, wherein said electrically conductive panel has an upstream airflow side and a downstream airflow side;
    each of said plural air ventilation holes having a waveguide electrically and mechanically coupled to said electrically conductive panel at the periphery of the air ventilation hole, the axis of said waveguide extending away from said electrically conductive panel in a direction approximately normal to said conductive panel; and
    a plurality of smooth [surfaces] *transitions* joining said upstream airflow side of said electrically conductive panel with the inner surface of each of said waveguides.

14. An electronic device enclosure having air ventilation and EMI-attenuation characteristics comprising:
    a casing;
    at least one EMI-attenuating air ventilation panel, each comprising an electrically conductive panel having at least one air ventilation hole formed in it, wherein each of said ventilation holes has a waveguide electrically and mechanically coupled to said electrically conductive panel at the periphery of said air ventilation holes, the axis of said waveguides extending away from said electrically conductive panel in a direction approximately normal to said electrically conductive panel, wherein said electrically conductive panel has an upstream airflow side and a downstream airflow side;
    a smooth [surface] *transition* joining said upstream airflow side of said electrically conductive panel with the inner surface of each of said waveguides; and
    a cooling fan for circulating air into said casing through said air ventilation holes.

* * * * *